United States Patent
Espinosa et al.

(10) Patent No.: US 7,612,424 B1
(45) Date of Patent: Nov. 3, 2009

(54) NANOELECTROMECHANICAL BISTABLE CANTILEVER DEVICE

(75) Inventors: Horacio D. Espinosa, Winnetka, IL (US); Changhong Ke, Evanston, IL (US)

(73) Assignee: Northwestern University, Evanston, IL (US)

( * ) Notice: Subject to any disclaimer, the term of this patent is extended or adjusted under 35 U.S.C. 154(b) by 312 days.

(21) Appl. No.: 11/385,970

(22) Filed: Mar. 21, 2006

Related U.S. Application Data (60) Provisional application No. 60/701,586, filed on Jul. 22, 2005.

(51) Int. Cl.
*H01L 29/84* (2006.01)
*H01L 31/109* (2006.01)

(52) U.S. Cl. .................. 257/415; 257/419; 257/421; 257/595; 257/E29.344; 257/E29.345; 200/181; 361/278; 361/290; 361/298.5

(58) Field of Classification Search ............... 257/312, 257/415, 419, 595; 361/278, 290, 298.5; 200/181
See application file for complete search history.

(56) References Cited

U.S. PATENT DOCUMENTS

| | | | |
|---|---|---|---|
| 5,677,823 A | 10/1997 | Smith | 361/234 |
| 6,574,130 B2 | 6/2003 | Segal et al. | 365/129 |
| 6,643,165 B2 | 11/2003 | Segal et al. | 365/151 |
| 6,781,166 B2 | 8/2004 | Lieber et al. | 257/211 |
| 6,798,321 B2 * | 9/2004 | Hallbjorner | 335/78 |
| 6,836,424 B2 | 12/2004 | Segal et al. | 365/129 |
| 2002/0130353 A1 | 9/2002 | Lieber et al. | 257/315 |
| 2003/0089899 A1 | 5/2003 | Lieber et al. | 257/9 |

(Continued)

OTHER PUBLICATIONS

Y.T. Yang, K.L. Ekinci, X.M.H. Huang, L.M. Schiavone, M.L. Roukes, C.A. Zorman, and M. Mehregany, "Monocrytalline silicon carbide nanoelectromechanical systems," Appl. Phys. Lett. 78, 162, 2001.

(Continued)

*Primary Examiner*—Dao H Nguyen (57) ABSTRACT

Nano-electromechanical device having an electrically conductive nano-cantilever wherein the nano-cantilever has a free end that is movable relative to an electrically conductive substrate such as an electrode of a circuit. The circuit includes a power source connected to the electrode and to the nano-cantilever for providing a pull-in or pull-out voltage therebetween to effect bending movement of the nano-cantilever relative to the electrode. Feedback control is provided for varying the voltage between the electrode and the nano-cantilever in response to the position of the cantilever relative to the electrode. The device provides two stable positions of the nano-cantilever and a hysteresis loop in the current-voltage space between the pull-in voltage and the pull-out voltage. A first stable position of the nano-cantilever is provided at sub-nanometer gap between the free end of the nano-cantilever and the electrode with a pull-in voltage applied and with a stable tunneling electrical current present in the circuit. A second stable position of the nano-cantilever is provided with a pull-out voltage between the cantilever and the electrode with little or no tunneling electrical current present in the circuit. The nano-electromechanical device can be used in a scanning probe microscope, ultrasonic wave detection sensor, NEMS switch, random access memory element, gap sensor, logic device, and a bio-sensor when the nano-cantilever is functionalized with biomolecules that interact with species present in the ambient environment be them in air or aqueous solutions. In the latest case, the NEMS needs to be integrated with a microfluidic system.

28 Claims, 6 Drawing Sheets

U.S. PATENT DOCUMENTS

| | | | |
|---|---|---|---|
| 2003/0165074 A1 | 9/2003 | Segal et al. | 365/153 |
| 2003/0200521 A1 | 10/2003 | DeHon et al. | 716/16 |
| 2004/0027889 A1* | 2/2004 | Occhipinti et al. | 365/202 |
| 2004/0188721 A1 | 9/2004 | Lieber et al. | 257/211 |
| 2004/0214366 A1 | 10/2004 | Segal et al. | 438/53 |
| 2004/0214367 A1 | 10/2004 | Segal et al. | 438/53 |
| 2006/0086994 A1* | 4/2006 | Viefers et al. | 257/415 |

OTHER PUBLICATIONS

A.N. Cleland and M.L. Roukes, "Fabrication of high frequency nanometer scale mechanical resonators from bulk Si crystals," Appl. Phys. Lett. 69, 2653, 1996.

A. Erbe, R.H. Blick, A. Tilke, A. Kriele, P.Kotthaus, "A mechanically flexible tunneling contact operating at radio frequencies", Appl. Phys. Lett. 73, 3751, 1998.

X.M.H. Huang, C.A. Zorman, M. Mehregany M.L. Roukes, "Nanodevice motion at microwave frequencies," Nature(London) 421, 496, 2003.

M.L. Rhodes, "Nanoelectromechanical Systems,", Technical Digest of the 2000 Solid-State Sensor and Actuator Workshop, 2000.

G. Abadal,et al., "Electromechanical model of a resonating nano-cantilever-based sensor for high-resolution and high-sensitivity mass detection," Nanotechnology 12, 100, 2001.

A.N. Cleland, M.L. Roukes, "A Nanometer-scale Mechanical Electrometer," Nature(London)392, pp. 160-162, 1998.

R. Martel, T. Schmidt, H.R. Shea, T. Hertel, Ph. Avouris, "Single- and multi-wall carbon nanotube field-effect transistors," Appl. Phys. Lett. 73, 2447, 1998.

S. Akita, Y. Nakayama, S. Mizooka, Y. Takano, T. Okawa, Y. Miyatake, S. Yamanaka, M. Tsuji, T. Nosaka, "Nanotweezers consisting of carbon nanotubes operating in an atomic force microscope," Appl. Phys. Lett., vol. 79, pp. 1691-1693, 2001.

P. Kim, C.M. Lieber, "Nanotube Nanotweezers," Science, vol. 126 pp. 2148-2150, 1999.

T. Rueckes, K. Kim, E. Joslevich, G.Y. Tseng, C. Cheung, C.M. Lieber, "Carbon nanotube-based nonvolatile random access memory for molecular computing", Science, vol. 289, pp. 94-97, 2000.

J. Kinaret, T. Nord, S. Viefers, "A Carbon-nanotube-based nanorelay," Appl. Phys. Lett., vol. 82, pp. 1287-1289, 2003.

A.M. Fennimore, et al., "Rotational actuator based on carbon nanotubes," Nature(London), vol. 424, pp. 408-410, 2003.

Dequesnes, et al., "Calculation of Pull-In Votages for Carbon-Nanotube-Based Nanoelectromechanical Switches", Nanotechnology13, pp. 120-131, 2002.

M.M.J. Treacy, T.W. Ebbesen, J.M. Gilbson, "Exceptionally high Young's modulus observed for individual carbon nanotubes," Nature(London)381, 678, 1996.

R.J. Chen, et al., "An Investigation of the Mechanisms of Electronic Sensing of Protein Adsorption on Carbon Nanotube Devices", J. Am. Chem. Soc., 126, 1563, 2004.

K.H. Kim, N. Moldovan, C. Ke, H.D. Espinosa, "A Novel AFM Chip for Fountain Pen Nanolithography-Design and Microfabrication," Materials Research Society Symposium Proceedings, vol. 782, 2003 Fall MRS Meeting, A5.56.1, 2004.

K.H. Kim, N. Moldovan, H.D. Espinosa, "A Nanofountain Probe with Sub-100 nm Molecular Writing Resolution," Small, vol. 1, No. 6, pp. 632-635, 2005.

C.-H. Ke, N. Pugno, B. Peng, H.D. Espinosa, "Experiments and Modeling of Carbon-Nanotube Based NEMS Devices", J. Mech. Phys. Solids, 53 (6), pp. 1314-1333, 2005.

C.-H. Ke, H.D. Espinosa, "Feedback Controlled Nanocantilever Device", Appl. Phys. Lett., vol. 85, No. 4, 2004, pp. 681-683.

L.M. Jonsson, T. Nord, J.M. Kinaret, S. Viefers, "Effects of Surface Forces and Phonon Dissipation in a Three-Terminal Nanorelay", J. Appl. Phys., vol. 96, pp. 629-635, 2004.

R. Tarkiainen, M. Ahlskog, J. Penttila, L. Roschier, P. Hakonen, M. Paalanen, E.Sonin, "Multiwalled carbon nanotube: Luttinger versus Fermi liquid," Phys. Rev.B 64, 195412, 2001.

J. Sun, Z.X. Zhang, S.M.Hou, G.M. Zhang, Z.N. Gu, X.Y. Zhao, W.M. Liu, Z.Q. Zue, "Work function of single-walled carbon nanotubes determined by field emission microscopy," Appl.Phys. A: Mater. Sci. Process. 75, 479, 2002.

S. Frank, P. Poncharal, P. Wang, W.A. Heer, "Carbon Nanotube Quantum Resistors", Science 280, 1744, 1998.

A. Bachtold, et al., "Scanned Probe Microscopy of Electronic Transport in Carbon Nanotubes", Phys. Rev. Lett. 84, 6082, 2000.

A. Bachtold, C. Strunk, J.P. Salvetat, J.M. Bonard, L. Forro, T. Nussbaumer, C. Schonenberger, "Aharonov-Bohm oscillations in carbon nanotubes", Nature(London)397, 673, 1999.

C. Schöneneberger, A. Bachtold, C. Strunk, J.P. Salvetat, L. Forro, "Interference and Interaction in multi-wall carbon nanotubes", Appl. Phys. A: Mater. Sci. Process. 69, 283, 1999.

P.L. McEuen, M. Bockrath, D.H. Cobden, Y.G. Yoon, S.G. Louie, "Disorder, Pseudospins, and Backscattering in Carbon Nanotubes", Phys. Rev. Lett. 83, 5098, 1999.

P.A. Williams, S.J. Papadakis, M.R. Falvo, "Fabrication of nanometer-scale mechanical devices incorporating individual multiwalled carbon nanotubes as torsional springs," Appl. Phys. Lett., 82, 805, 2003.

M.F. Yu, O. Lourie, M.J. Dyer, K. Moloni, T.F. Kelly, R.S. Ruoff, "Strength and Breaking Mechanism of Mulitwalled Carbon Nanotubes Under Tensile Load", Science 287, 637, 2000.

Y.G. Zhang, A. Chang, J. Cao, Q. Wang, W. Kim, Y.M. Li, N. Morris, E. Yenilmez, J. Kong, H.J. Dai, "Electric-field-directed growth of aligned single-walled carbon nanotubes", Appl. Phys. Lett. 79, 3155, 2001.

K. Yamamoto, S. Akita, Y. Nakayama, "Orientation and purification of carbon nanotubes using ac electrophoresis", J. Phys. D 31, L34, 1998.

A. Bezryadin, C. Dekker, "Electrostatic trapping of single conducting nanoparticles between nanoelectrodes", Appl. Phys. Lett. 71, 1273. 1997.

* cited by examiner

NANOELECTROMECHANICAL BISTABLE CANTILEVER DEVICE

This application claims priority and benefits of provisional application Ser. No. 60/701,586 filed Jul. 22, 2005.

CONTRACTUAL ORIGIN OF THE INVENTION

This invention was supported by funding under National Science Foundation Grant/Contract No. CMS-0120866 and Federal Aviation Association Grant/Contract No. DTFA03-01-C-0031. The Government may have certain rights in the invention.

FIELD OF THE INVENTION

The present invention relates to an electromechanical device having a nano-cantilever movable relative to an electrode and feedback control in a manner to provide two stable cantilever positions and a hystersis loop in the current-voltage space between a pull-in voltage and a pull-out voltage as well as to a method of its manufacture and use.

BACKGROUND OF THE INVENTION

Nanoelectromechanical systems (NEMS) are attracting significant attention because of their properties to enable superior electronic components and sensors. By exploiting nanoscale effects, NEMS present interesting and unique characteristics. For instance, NEMS-based devices can have an extremely high fundamental frequency as described by Y. T. Yang, K. L. Ekinci, X. M. H. Huang, L. M. Schiavone, M. L. Roukes, C. A. Zorman, and M. Mehregany, Appl. Phys. Lett. 78, 162 (2001); by A. N. Cleland and M. L. Roukes, Appl. Phys. Lett. 69, 2653 (1996); by A. Erbe, R. H. Blick, A. Tilke, A. Kriele, and P. Kotthaus, Appl. Phys. Lett. 73, 3751 (1998); and by X. M. H Huang, C. A. Zorman, M. Mehregany, and M. L. Roukes, Nature (London) 421, 496 (2003) and preserve very high mechanical responsivity as described by M. L. Rhodes, "Nanoelectromechanical system,", Technical Digest of the 2000 Solid-State Sensor and Actuator Workshop, 2000.

Several NEMS devices have been reported, such as mass sensors described by G. Abadal, Z. J. Davis, B. Helbo, X. Borrise, R. Ruiz, A. Boisen, F. Campabadal, J. Esteve, E. Figueras, F. Perez-Murano, and N. Bamiol, Nanotechnology 12, 100 (2001); RF resonators described in the same article, field-effect transistors described by R. Martel, T. Schmidt, H. R. Shea, T. Hertel, and Ph. Avouris, Appl. Phys. Lett. 73, 2447 (1998); and electrometers described by A. N. Cleland and M. L. Roukes, Nature (London) 392, 160 (1998).

Carbon nanotubes (CNTs) have long been considered ideal building blocks for NEMS devices due to their superior electrical and mechanical properties. CNT-based NEMS devices such as nanotweezers have been reported by S. Akita, Y. Nakayama, S. Mizooka, Y. Takano, T. Okawa, Y. Miyatake, S. Yamanaka, M. Tsuji, and T. Nosaka, Appl. Phys. Lett. 79, 1691 (2001) and by P. Kim and C. M. Lieber, Science 126, 2148 (1999); nonvolatile random access memory elements reported by T. Rueckes, K. Kim, E. Joslevich, G. Y. Tseng, C. Cheung, and C. M. Lieber, Science 289, 94 (2000); nanorelays reported by J. Kinaret, T. Nord, and S. Viefers, Appl. Phys. Lett. 82, 1287 (2002); and rotational actuators reported by A. M. Fennimore, T. D. Yuzvlnsky, W. Q. Han, M. S. Fuhrer, J. Cummings, and A. Zettl, Nature (London) 424, 408 (2003).

SUMMARY OF THE INVENTION

The present invention provides in an embodiment a nanoelectromechanical device having features to provide two stable cantilever positions and a hysteresis loop in the current-voltage space between a pull-in voltage and a pull-out voltage. The nanoelectromechanical device comprises an electrically conductive or semiconducting nano-cantilever wherein the nano-cantilever has a free end that is movable relative to an electrically conductive substrate such as an electrode of a circuit. The circuit includes a power source connected to the substrate and to the nano-cantilever for providing a pull-in or pull-out voltage therebetween to effect bending movement of the nano-cantilever relative to the substrate. Feedback control is provided for varying the voltage between the substrate and the nano-cantilever in response to the position of the cantilever relative to the substrate in a manner that the device provides two stable positions of the nano-cantilever and a hystersis loop in the current-voltage space between the pull-in voltage and the pull-out voltage. For purposes of illustration and not limitation, the nano-cantilever can comprise a carbon nanotube, metallic nanowire, or doped Si nanowire.

In a particular embodiment of the invention, a first stable position of the nano-cantilever is provided at a sub-nanometer (less about 1 nm) gap between the free end of the nano-cantilever and the substrate (e.g. electrode) with a pull-in voltage applied and with a stable tunneling electrical current present in the circuit. At the first stable position, the elastic force generated in the nano-cantilever from bending movement is equal to the electrostatic force at the stable tunneling current and the inter-atomic van der Waals force between the cantilever and the substrate. A second stable position of the nano-cantilever is provided with a pull-out voltage between the cantilever and the substrate. At the second stable position, the elastic force generated in the nano-cantilever from bending movement is equal to the electrostatic force with little or no tunneling current in the circuit and mostly negligible inter-atomic van der Waals force between the cantilever and the substrate.

In another particular embodiment of the invention, the feedback control comprises a resistor connected in the circuit between the power source and the substrate (e.g. electrode) or the nano-cantilever wherein the resistor has a resistance value greater than that of the nano-cantilever. The effect of the resistor is to reduce the voltage in response to the free end of the cantilever moving toward the substrate and to increase the voltage in response to the free end of the cantilever moving away from the substrate. A hysteretic response results.

The nano-electromechanical device pursuant to the invention can be used in a scanning probe microscope, ultrasonic wave detection sensor, NEMS switch, random access memory element, gap sensor, logic device, and a bio-sensor when the nano-cantilever is functionalized with biomolecules that interact with species present in the ambient environment be them in air or aqueous solutions. In the latest case, the device needs to be combined with a microfluidic system. A particular embodiment of the biosensor would employ a semiconducting nanowire that becomes conductive after molecular recognition. NEMS actuation and recording of tunneling current would then be used to sense such molecular recognition.

The invention also envisions in another embodiment an arrangement of a plurality of the electromechanical devices described above in a manner to permit multiplexing thereof.

The invention also envisions in another embodiment the combination of the electromechanical device described above and a solid state switch connected to one or more power sources in a manner that different voltages values (e.g. a pull-in voltage and a pull-out voltage) can be applied between the nano-cantilever and electrically conductive substrate to provide first and second stable positions of the nano-cantilever relative to the electrically conductive substrate.

The invention envisions in a further embodiment a method of making the electromechanical device described above wherein the nano-cantilever is self-assembled relative to the electrically conductive substrate.

Further details and advantages of the present invention will become apparent from the following detailed description taken with the following drawings.

DESCRIPTION OF THE DRAWINGS

FIGS. 2A and 2B show the characteristic of pull-in and pull-out processes for a device with $R_{ext}=9.015$ nm, $R_{int}=6$ nm, L=500 nm, H=100 nm, $R_0=1$ KΩ, and R=1 GΩ.

DESCRIPTION OF THE INVENTION

Figure 1:
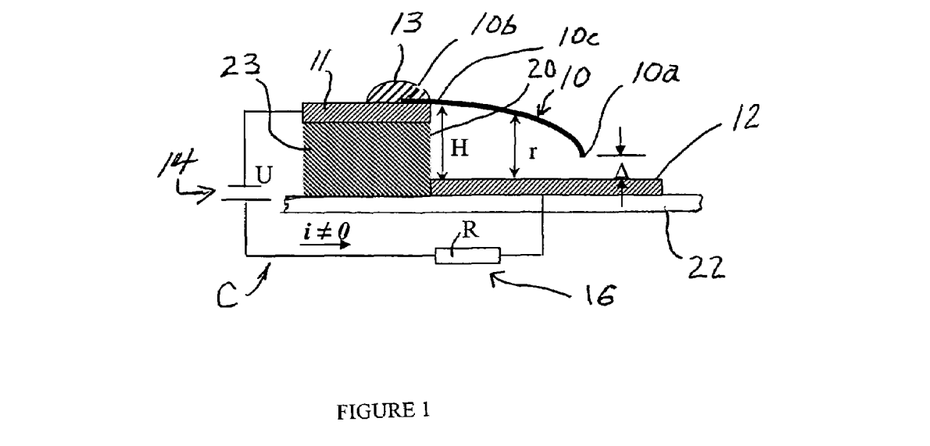
FIG. 1 is a schematic view of nano-electromechanical device with tunneling contacts pursuant to an illustrative embodiment of the invention where H is the initial step height and $\Delta$ is the gap between the deflected cantilever free end or tip and a bottom conductive substrate (electrode). R is the feedback resistor.

Referring to FIG. 1, a nano-electromechanical device is schematically shown for purposes of illustrating the invention and not limiting it. For example, the nano-electromechanical device is shown including a nano-cantilever 10 comprising electrically conductive or semiconducting material wherein the nano-cantilever has a free end or tip 10a that is movable relative to an electrically conductive substrate shown as an electrode 12 of a circuit C. The nano-cantilever also includes a fixed end 10b fixedly attached by electrically conductive attachment material 13 to an electrically conductive substrate shown as an electrical lead or contact 11 of the circuit C. The material 13 can comprise a metallic material deposited on the fixed end 10b in such a manner as to metallurgically attach the fixed end to the lead or contact 11. For purposes of illustration and not limitation, the attachment material 13 can comprise a metal or alloy, such as platinum (Pt) and tungsten (W), electron beam deposited on the fixed end 10b and the lead or contact 11 while the fixed end 10b is held by a nanomanipulator adjacent the lead or contact 11 so as to in effect weld the fixed end 10b on the lead or contact 11.

The circuit C further includes a conventional electrical power source 14, such as an Agilent 6614C power source, is connected in the circuit for providing a voltage between the cantilever 10 and the electrode 12 to effect bending movement of the nano-cantilever relative to the electrode. Pursuant to an embodiment of the invention, a feedback control 16 is provided in the form of resistor R for varying the voltage between the nano-cantilever 10 and the electrode 12 in response to the position of the cantilever relative to the electrode.

The nano-cantilever 10 includes an intermediate region 10c between the ends 10a, 10b wherein the intermediate region extends or spans across a micro-fabricated edge or step 20 having a height H. The edge or step 20 is formed on an oxide layer 23 on a support body 22. The electrical lead or contact 11 and the electrode 12 of circuit C are disposed on the layer 23 and the support body 22 as shown. For purposes of illustration and not limitation, the support body 22 may comprise a silicon wafer having a patterned oxide film or layer 23 thereon and on which the nano-cantilever 10 and the electrodes 11, 12 are disposed as shown in FIG. 1.

The nano-cantilever 10 can comprise a carbon nanotube that may be a single or multi-wall carbon nanotube. The carbon nanotube typically has a tube exterior diameter with a nano-scale dimension such as, for example, a tube exterior diameter in the range of about 1 nm to about 100 nm. The carbon nanotube can have a length suited to the particular application. Carbon nanotube lengths of about 0.1 microns to about 10 microns may be used in practice of certain embodiments of the invention, although the invention is not so limited.

Multi-walled carbon nanotubes for use in the practice of the invention are commercially available. For example, multi-walled carbon nanotubes useful in practice of the invention are available from Alfa Aesar of Ward Hill, Mass. These carbon nanotubes are provided by the manufacturer in bundles and can be separated to provide a single carbon nanotube for use as the nano-cantilever 10. For example, the bundle is subjected to ultrasonication in an aqueous liquid dispersant commercially available from Alfa Aesar. A droplet of the liquid containing the carbon nanotubes is then placed on a copper transmission electron microscope (TEM) grid and dried. By employing a 3-axes nanomanipulator from Klocke Nanotechnik, of Aachen, Germany, possessing sub-nanometer resolution, carbon nanotubes can be manipulated and mounted to the tip of manipulator probe inside a dual beam scanning electron microscopy (SEM)/focused ion beam (FIB) chamber (FEI Dual-Beam 235 FIB available from FEI Company, of Hillsboro, Oreg.). The TEM grid can be examined using SEM and protruding nanotubes identified. By approaching the nanomanipulator tungsten tip to a protruding and straight nanotube, good contact between the tip and the nanotube can be made. Such contact is assessed from the motion of the nanotube while slightly lifting the probe. Electron beam induced deposition (EBID) of platinum or other material can be employed to attach or weld the nanotube to the probe. The probe is then displaced to pull out the nanotube from the grid and in doing so a nano-cantilever is obtained for use in the device as shown in FIG. 1. The carbon nanotube cantilever can be further nanomanipulated and attached to the lead or contact 11 using material 13 deposited by EBID using a dual beam scanning electron microscopy (SEM)/focused ion beam (FIB) together with the nanomanipulator or any other suitable attaching technique The nano-cantilever 10 alternatively can comprise metallic nanowire which may have a wire exterior diameter of about 3 nm to about 100 nm and a length suited to the particular application. Metallic nanowire lengths of about 0.1 microns to about 10 microns may be used in practice of certain embodiments of the invention, although the invention is not so limited. The metallic nanowire may comprise palladium (Pd), gold (Au), platinum (Pt), or any other suitable metal or alloy. A palladium nanowire having a diameter of about 100 nm and length of 10 microns useful in practice of the invention is obtained from the Argonne National Laboratory in Illinois. The metallic nanowire can be nanomanipulated and metallurgically attached to the lead or contact 11 using material 13 (e.g. platinum (Pt) and tungsten (W)) deposited by EBID using a dual beam scanning electron microscopy (SEM)/focused ion beam (FIB) together with the nanomanipulator or any other suitable attaching technique.

The nano-cantilever 10 alternatively can comprise a semiconducting material such as including, but not limited to, a doped silicon nanowire which can be N type or P type).

In operation of the nanoelectromechanical device described above, when the applied voltage $U<V_{PI}$(pull-in voltage), the electrostatic force is balanced by the elastic force from the deflection of the nano-cantilever 10. The nano-cantilever 10 remains in the "upper" stable equilibrium position (second position in the claims). The deflection is controlled by the applied voltage. When the applied voltage exceeds a pull-in voltage, the system becomes unstable. With any increase in the applied voltage U, the electrostatic force becomes larger than the elastic force and the nano-cantilever 10 accelerates towards the bottom electrode 12 in FIG. 1. When the free end or tip 10a of the nano-cantilever 10 is very close to the electrode at a sub-nanometer distance (i.e., gap $\Delta \approx 0.7$ nm) as shown in FIG. 1, substantial tunneling electrical current passes between the free end or tip 10a of the nano-cantilever 10 and the bottom electrode 12. Due to the existence of the feedback control 16 in the form of resistor R in the circuit C, the voltage applied to the nano-cantilever 10 is reduced, weakening the electric field. Because of the kinetic energy of the nano-cantilever 10, it continues to deflect downward and the tunneling current increases, weakening the electric field further. In this case, the elastic force generated by deflection of the nano-cantilever is larger than the electrostatic force and the nano-cantilever decelerates and changes the direction of motion. This decreases the tunneling current and the electrical field recovers. If there is damping in the system from thermal-elasticity or other sources, the kinetic energy of the nano-cantilever 10 is dissipated and the nano-cantilever stays at the position where the electrostatic force and van der Waals force from the atomic interaction between the cantilever and the electrode are equal to the elastic force from cantilever deflection, and a stable tunneling current is established in the device circuit C. This is the "lower" stable equilibrium position (first position in the claims) for the nano-cantilever 10.

At this point, if the applied voltage U decreases, the nano-cantilever 10 starts retracting away from electrode 12. When U decreases to a certain value, called pull-out voltage $V_{PO}$, the nano-cantilever is released from its lower equilibrium position and returns back to its upper stable equilibrium position. At the same time, the electrical current in the device diminishes substantially. Basically the pull-in and pull-out processes follow a hysteretic loop, FIGS. 2A and 2B, for the applied voltage and the electrical current in the device. The upper and lower equilibrium positions correspond to "ON" and "OFF" states of a switch, respectively. In effect, the feedback control resistor R reduces the applied voltage in response to the free end or tip 10a of the nano-cantilever moving toward the electrode 12 and increases the applied voltage in response to the free end or tip of the cantilever moving away from the electrode 12. Also the existence of the tunneling current and feedback resistor R make the lower stable equilibrium states very robust, which is key to some applications of interest described herein. The resistor reduces the voltage in response to the free end of the cantilever moving toward the electrode and increases the voltage in response to the free end of the cantilever moving away from the electrode.

The nano-electromechanical device pursuant to the invention thereby provides two stable positions of the nano-cantilever and a hysteresis loop in the current-voltage space between a pull-in voltage and a pull-out voltage. The first stable "equilibrium' position of the nano-cantilever occurs at a sub-nanometer gap between the free end or tip 10a of the nano-cantilever 10 and the electrode 12 with a pull-in voltage applied and with a stable tunneling electrical current present in the circuit C. At the first stable position, the elastic force generated in the nano-cantilever from bending movement is equal to the electrostatic force at the stable tunneling current and the inter-atomic van der Waals force. The second stable "equilibrium" position of the nano-cantilever occurs with a pull-out voltage between the cantilever and the electrode with little or no tunneling current present in the circuit C. At the second stable position, the elastic force generated in the nano-cantilever from bending movement is equal to the electrostatic force with little or no tunneling current in the circuit and mostly negligible inter-atomic van der Waals force.

A quantification of the nano-electromechanical device described above using a carbon nanotube cantilever 10 can be made by means of electromechanical modeling of the device. The carbon nanotube cantilever is considered to be a homogeneous, perfect conductor of length L, with outer and inner radii $R_{ext}$ and $R_{int}$, respectively.

The capacitance per unit length along the carbon nanotube can be approximated as:

$$C = C_d(r)\{1 + 0.85[(H+R_{ext})^2 R_{ext}]^{1/3} \delta(z-L)\} \quad (1)$$

where the first term in the bracket accounts for the uniform charge along the side surface of the nanotube and the second term accounts for the concentrated charge at the free end 10a of the nanotube. $\delta(z)$ is the Dirac distribution function and z is the axial coordinate of the nanotube. $C_d(r)$ is the distributed capacitance along the side surface per unit length for an infinitely long nanotube, which is given by $$C_d(r) = \frac{2\pi\varepsilon_0}{\cosh^{-1}\left(\frac{r}{R_{ext}}\right)} \quad (2)$$

where r is the distance between the axis of the cylinder and the substrate (electrode 12), and $\varepsilon_0$ is the permittivity of vacuum ($\varepsilon_0 = 8.854 \times 10^{-12} C^2 N^{-1} m^2$).

Thus, the electrostatic force per unit length is given by $$q_{elec} = \frac{1}{2} V^2 \left(\frac{dC_d}{dr}\right)\{1 + 0.85[(H+R_{ext})^2 R_{ext}]^{1/3} \delta(z-L)\} \quad (3)$$

(Here we consider the deflection of the carbon nanotube cantilever to be small and linear. Thus, the electrostatic force can be approximated by its vertical components, although a more accurate modeling, including finite kinematics to account for large deformations and the horizontal component of the electrostatic force, may be used).

The upper equilibrium configuration equation for the carbon nanotube cantilever, based on a continuum model, is given by $$EI \frac{d^4 W}{dz^4} = q_{elec} + q_{vdw} \qquad (4)$$

where E is the Young's modulus of the carbon nanotube and W is the deflection. I is the moment of inertia of the nanotube crossection, i.e. $I=\pi(R^4_{ext}-R^4_{int})/4$. $q_{vdw}$ is the van der Waals force (per unit length) between the nanotube and the substrate (electrode 12) and can be evaluated using the method reported originally by Reuckes et al., in *Science* 289, 94 (2000) and later employed by Dequesnes et al. in *Nanotechnology* 13, 120 (20002), both of which are incorporated herein by reference, assuming that the substrate consists of 30 graphite layers.

Numerical integration of Eq. (4) provides the cantilever free end or tip deflection, as a function of applied voltage, as well as the pull-in voltage.

To examine the lower equilibrium configuration, the current flow in the system needs to be included. The resistance of the tunneling contact between of the nanotube cantilever 10 and the bottom electrode 12 can be described as $R_T[\Delta]=R_0 \exp(\Delta/\lambda)$. Here $R_0$ is the contact resistance between the nanotube cantilever and the bottom electrode and can be evaluated from experimental results. $\lambda$ is a material constant defined by $\lambda^{-1}=1.02\sqrt{\Phi(eV)}$Å$^{-1}$, with $\Phi$ being the work function (for multiwalled nanotubes (MWNT) $\Phi \approx 5.0$ eV)). Hence, $\lambda^{-1} \approx 2.28$ Å$^{-1}$, which implies that the contact resistance increases by nearly one order of magnitude for every 1 Å increase of the gap size.

When the gap between the free end or tip 10a of the carbon nanotube cantilever and the substrate (electrode 12) becomes very small (e.g., $\Delta \approx 0.7$ nm), a tunneling current is established in the device. In regard to the electron transport inside the MWNT, both ballistic and diffusive results have been reported and the difference is inferred to be related to the preparation of the sample and measurement techniques. In the analysis of the device of the invention, the resistance of the nanotube $R_{cnt}$ is regarded as part of the feedback resistance R in the circuit. In this approach, $R_{cnt}<<R$, thus, the change in the electrostatic force along the nanotube due to the voltage drop on the nanotube itself is neglected. In the model, we assume the potential along the nanotube cantilever is constant, and that the voltage drop takes place at the tunneling gap and feedback resistor R only [i.e. the resistance of nanotube itself (~MΩ) and the contact resistance between the nanotube and the upper electrode (~KΩ) are several orders of magnitude smaller compared to the feedback resistor R (~GΩ). Thus, for large gaps (i.e., $\Delta>0.7$ nm), the voltage drop will occur mostly on the gap. For small gaps, (i.e., $0<0.5$ nm) most of the voltage drop will take place on the feedback resistor]. The relation between the voltage drop V across the gap and the gap size $\Delta$ can be described as $$\frac{V}{U} \frac{R}{R_0} \exp(-\Delta/\lambda) = 1 - \frac{V}{U} \qquad (5)$$

The corresponding tunneling current is $i=(V/R_0)\exp(-\Delta/\lambda)$. From Eq. (5), we can see that the voltage drop across the gap, V, is not only dependent on gap size, but also dependent on the feedback resistance R.

By solving Eqs. (4) and (5) simultaneously, the voltage gap relation for the lower equilibrium position is obtained.

Figure 2A:
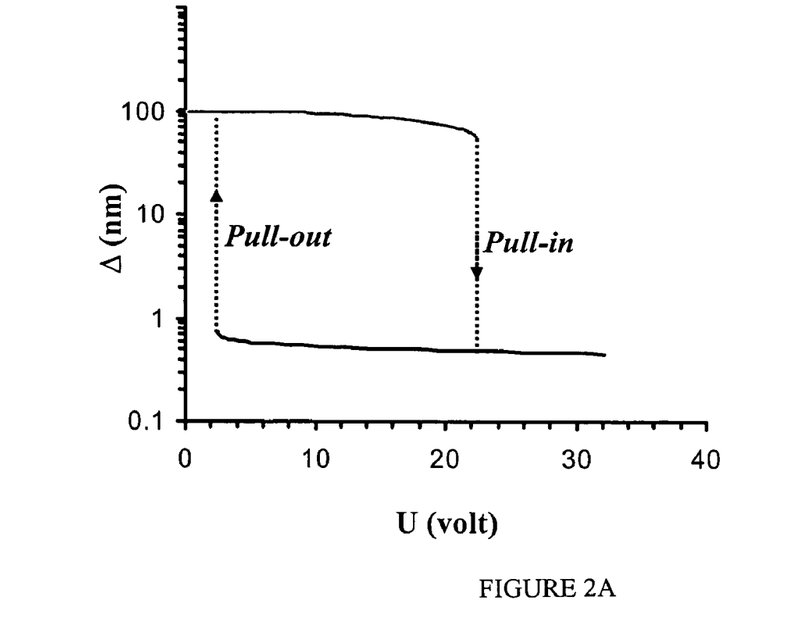
FIG. 2A shows the relation between the gap $\Delta$ and the applied voltage U.
Figure 2B:
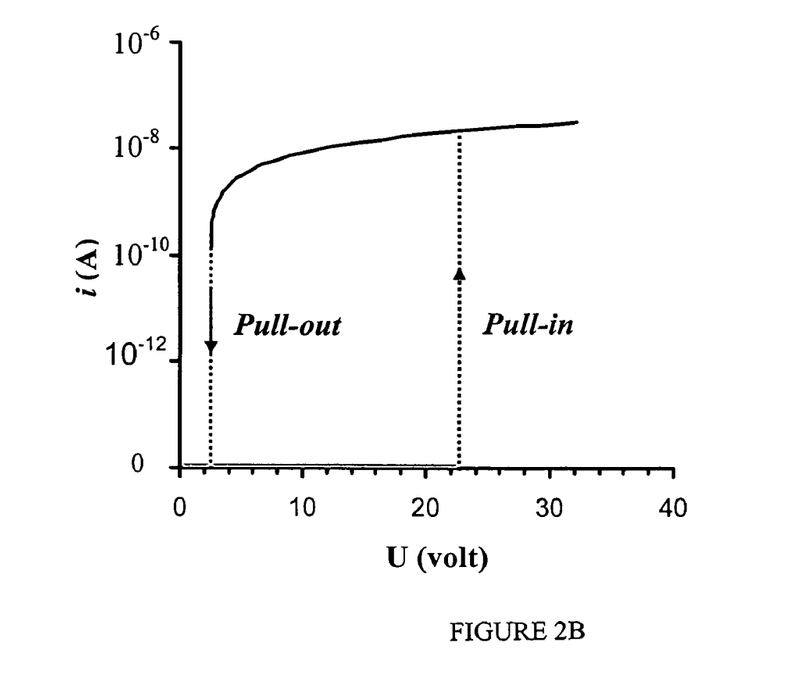
FIG. 2B shows the relation between the current i in the circuit and the applied voltage U.

For simulating performance of the above described nanoelectromechanical device, the following parameters were used: multiwalled carbon nanotube cantilever with E=1.2 T Pa, $R_{int}$=6 nm and ten layers (intralayer distance is assumed 0.335 nm) providing $R_{ext}$ of 9.015 nm, L=500 nm and H=100 nm. Resistances $R_0$=1 KΩ and R=1 GΩ are also employed. By numerically solving Eqs. (4) and (5) using integration method, we identify a pull-in voltage $V_{PI}$=22.48 V and a pull-out voltage $V_{PO}$=2.57 V. FIGS. 2A, 2B show the plots of the $\Delta$–U and i–U characteristic signatures. It is clearly seen that there is a hysteresis loop on each of the two characteristic curves shown in FIGS. 2A, 2B, which describes the lower and upper equilibrium stable positions and the pull-in and pull-out processes. The hysteresis loop can be controlled by appropriate selection of geometric and electric parameters. This hysteretic behavior can be exploited to build NEMS switches or random access memory elements operating at gigahertz frequencies.

The simulation result shows that the van der Waals (vdw) force is important in the design and optimization of the device. As expected, the vdw force becomes substantial when the deflected cantilever free end or tip almost touches the substrate (electrode 12). If the vdw force is large enough to balance the elastic force, "stiction" occurs, which means that the nanotube cantilever will be held at the lower stable equilibrium position. For example, for the device considered above, if the length of the nanotube cantilever increases to 1 µm, stiction will take place. For some applications, this effect could be desirable, while for others such as switches in random access memory elements, it should be avoided.

Because of the strong (exponential) dependence of current on the gap, feedback should be employed to keep the gap and the corresponding current within the range of interest. Unlike the force feedback control mechanism employed in accelerometers (S. D. Senturia, *Microsystem Design*, Kluwer Academic Publisher, 2000), e.g., ADXL50 (Analog Devices of Norwood, Mass.), a resistor R is incorporated in the circuit of the device pursuant to the invention for this purpose. The function of the feedback control resistor R in the device pursuant to the invention is to adjust the voltage, V, applied to the carbon nanotube cantilever as a function of its configuration (position relative to electrode 12). When there is tunneling, $V \leq U$. From Eq. (5), it is clear that feedback control resistor R has to satisfy the following relation in order to result in a device with a hysteretic characteristic, namely:

$$R \geq \frac{V_{PI} - V}{V} R_0 \exp(\Delta/\lambda) \qquad (6)$$

where V and $\Delta$ are obtained by solving Eq. (4).

In order to assess the effect of thermal vibrations on the device performance, the vibration of the nanotube is approximated by the model reported by Treacy et al., *Nature (London)* 381, 678 (1996). This Treacy et al. article is incorporated herein by reference. According to this model, the CNT tip vibration amplitude is $A=\sqrt{0.4243[L^3 kT/E(R_{ext}^4-R_{int}^4)]}$, where k is the Boltzmann's constant ($1.38 \times 10^{-23}$ J/K) and T is the temperature in degrees Kelvin. For the nano-cantilever with the earlier considered parameters, this equation gives a vibration amplitude of 1.86 Å at room temperature (300 K) and 0.2 Å at 4.2 K. It is noted that the tunneling current will vary with temperature. However, the overall characteristics of the device will not change, i.e., the thermal effects can not switch the carbon nanotube cantilever from the lower equilibrium position to the upper equilibrium position or vice versa.

It is apparent from the above description that the invention provides a feedback-controlled, switchable cantilever-based NEMS device. Although the description is based on carbon nanotube or metallic nanowire cantilevers, other possibilities include doped Si nanowires and other materials, which could be more easily integrated to current microelectronics technology. Moreover, the nano-electromechanical device pursuant to the invention can be used in a scanning probe microscope, ultrasonic wave detection sensor, NEMS switch, random access memory element, gap sensor, logic device, and a biosensor when the nano-cantilever is functionalized with biomolecules that interact with species in the ambient environment. For example, the nano-cantilever can be functionalized with biomolecules by coating the nano-cantilever with proteins as described by R. J. Chen, H. C. Choi, S. Bangsaruntip, E. Yenilmez, X. Tang, Q. Wang, Y. Chang, and H. Dai, *J. Am. Chem. Soc.*, 126, 1563 (2004), the teachings of which are incorporated herein by reference. A particular embodiment of the biosensor would employ a semiconducting nanowire that becomes conductive after molecular recognition. NEMS actuation and recording of tunneling current would then be used to sense such molecular recognition.

Figure 3A:
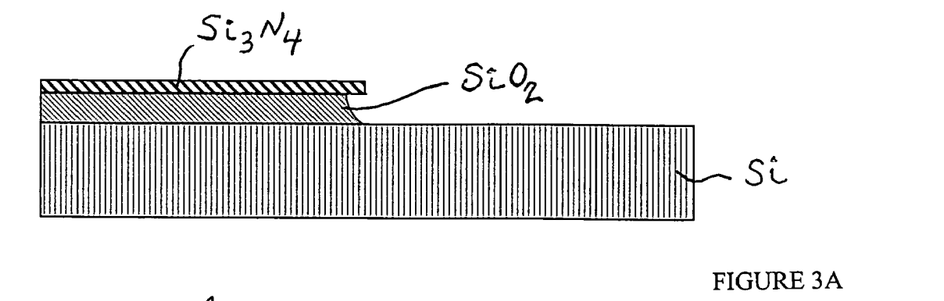
FIGS. 3A, 3B, and 3C are cross-section views of steps in fabrication of a nano-electromechanical device pursuant to another illustrative embodiment of the invention.
Figure 3B:
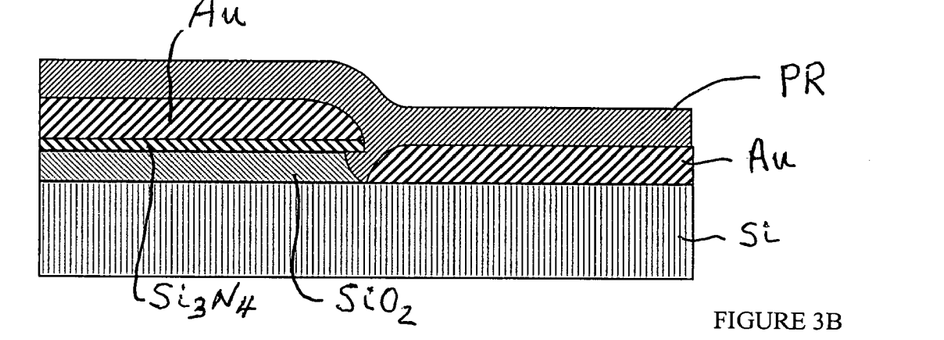
Figure 3C:
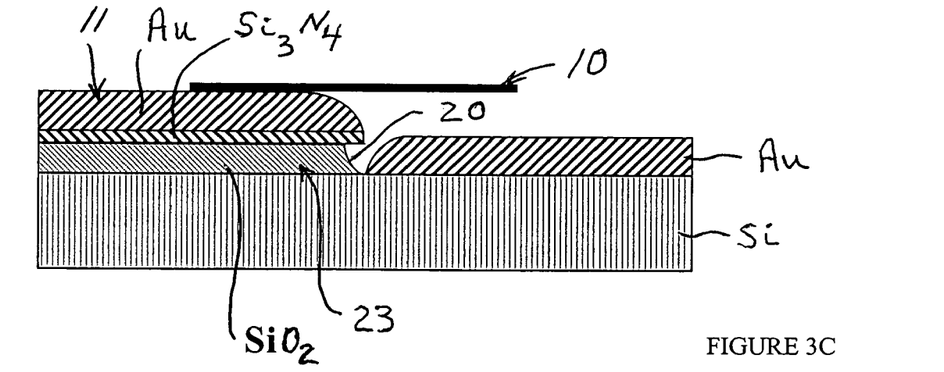

FIGS. 3A, 3B, and 3C illustrative schematically fabrication steps are shown for making a nanoelectromechanical device pursuant to an embodiment of the invention. These fabrication steps are shown for purposes of illustration and not limitation since other fabrication steps may be employed to manufacture the device. The device fabrication steps are schematically shown in FIGS. 3A, 3B and 3C. In a first step shown in FIG. 3A, a sharp edge or step on an electrical insulating layer is produced by low pressure chemical vapor deposition (LPCVD) deposition of a sandwich of $SiO_2/Si_3N_4$ (0.5 μm thick/0.5 μm thick) followed by $CF_4$-reactive ion etching (RIE). Subsequently, the oxide is slightly under etched, in buffered hydrofluoric (HF) solution, to form a submicron-width $Si_3N_4$ overhang. After the edge or step 20 is formed, a gold (Au) film 350 nm-thick is deposited and patterned by photo-lithography using photoresist PR in the shape of a long, about 10 micron wide, conductive lead crossing the step (FIG. 3B). At the step or edge, the conductive lead is broken, to form upper and lower electrodes 11, 12 for the device. Subsequent to the metal patterning, one carbon nanotube 10 will be put in place using the nanomanipulator and nano-welded using focused ion beam (FIG. 3C).

Figures 4A, 4B:
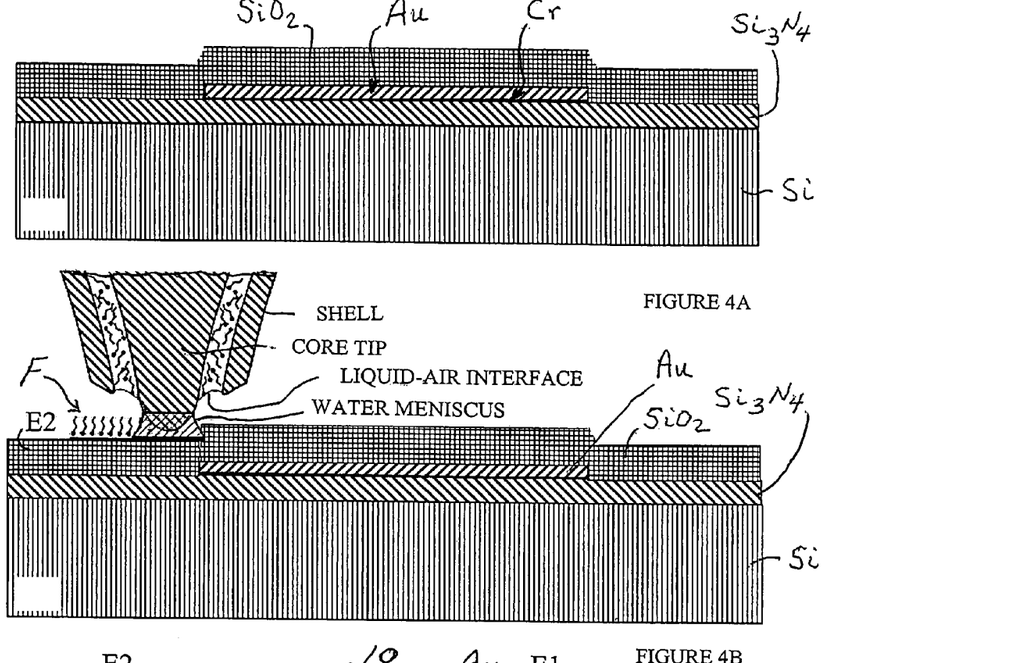
FIGS. 4A, 4B, 4C, 4D and 4E are schematic views of alternative fabrication steps for making a nano-electromechanical device embodying self-assembly of the nano-cantilever.
Figure 4C:
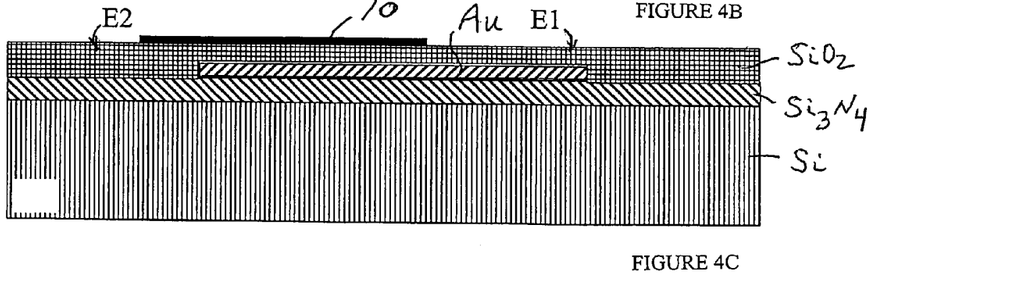
Figure 4D:
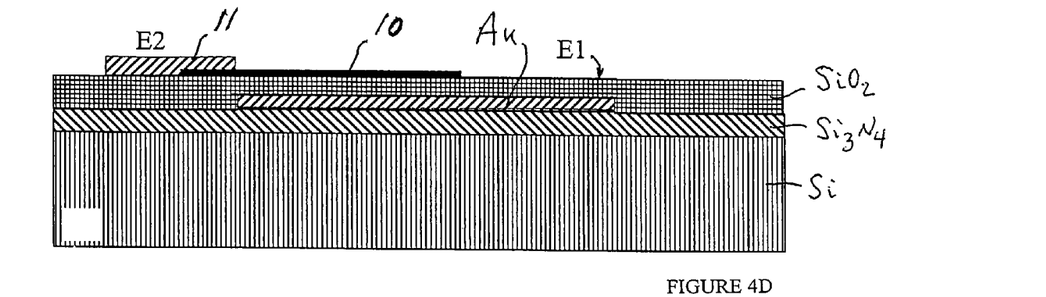
Figure 4E:
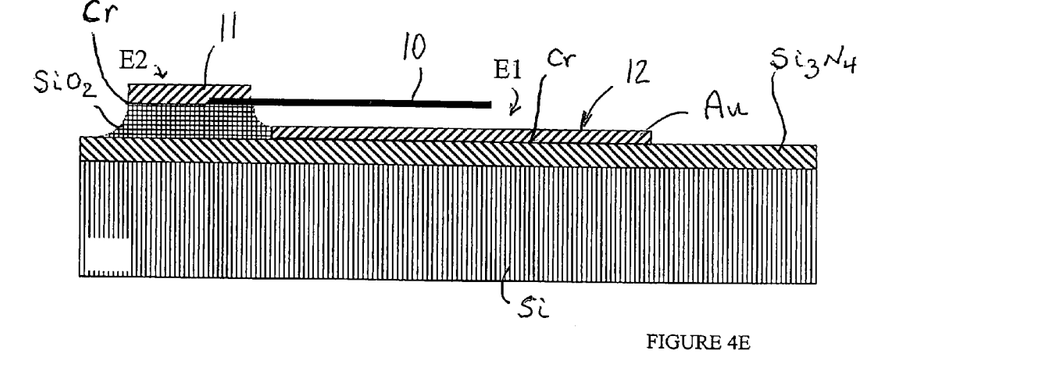

Since placement of nanotubes using a nanomanipulator is a slow procedure with very low throughput, another fabrication approach, directed self-assembly, is suitable for the fabrication of arrays of CNT bistable elements. In this case, the device fabrication would follow the steps schematically shown in FIGS. 4A, 4B, 4C, 4D and 4E:

(a) A 1-μm-thick $Si_3N_4$ dielectric film is deposited on a Si wafer by LPCVD, FIG. 4A. Then, a 50-nm-thick gold film (with a 5 nm Cr film as an adhesion layer) is deposited by e-beam evaporation and patterned by lithography to form a bottom electrode. Then, a 1 μm-thick fugitive $SiO_2$ layer is deposited by plasma enhanced chemical vapor deposition (PECVD), FIG. 4A;

(b) A fountain-pen nanolithography (FPN) technique described by K.-H. Kim, N. Moldovan, C. Ke and H. D. Espinosa, "*A Novel AFM Chip, for Fountain Pen Nanolithography—Design and Microfabrication,*" Materials Research Society Symposium Proceedings, Vol. 782, 2003 Fall MRS Meeting, A5.56.1, 2004; K.-H. Kim, N. Moldovan, and H. D. Espinosa, "*A Nanofountain Probe with Sub-100 nm Molecular Writing Resolution,*" Small, Vol. 1, No. 6, pp. 632-635, 2005, the teachings of which are incorporated herein by reference, is then employed to functionalize specific areas, with widths down to 40 nm, either with polar chemical groups (such as the amino groups ($—NH_2/—NH_3^+$) of cysteamine) or carboxyl ($—COOH/—COO^-$) or with non-polar groups (such as methyl ($—CH_3$) from molecules like 1-octadecanethiol, ODT). In FIG. 4B, an area overlying an end region E2 of the nano-cantilever is shown being functionalized using a nanolithographic fountain-pen tip having outer annular shell and inner core tip as shown to deposit functionalizing molecules F. The invention envisions using other methods such as nano-imprinting technique to deposit the functionalizing molecules;

(c) The substrate is dipped into a solution containing prefunctionalized (with polar chemical groups) CNTs (carbon nanotubes) or NWs (nanowires), to adhere and self-assembly to the functionalized area. The nano-cantilever 10 is self-assembled on the functionalized area so that the bottom electrode is disposed beneath a first end region E1 of the nano-cantilever, FIG. 4C. The invention envisions using other methods such as biomolecules (e.g. proteins) to functionalize the CNT's or NW's;

(d) The chip is patterned with e-beam lithography and e-beam evaporation of 100 nm gold film (lift off, with a 5 nm Cr film as adhesion layer) to form a top electrode 11 on the nano-cantilever 10 adjacent second end region E2 thereof, FIG. 4D;

(e) Removal of the fugitive $SiO_2$ layer between the first end region of the nano-cantilever and the bottom Au electrode using wet etching (HF) is effected to free the first end region E1 of the nano-cantilever and space it from the bottom electrode 12 to complete the manufacturing process, FIG. 4E.

Figure 5A:
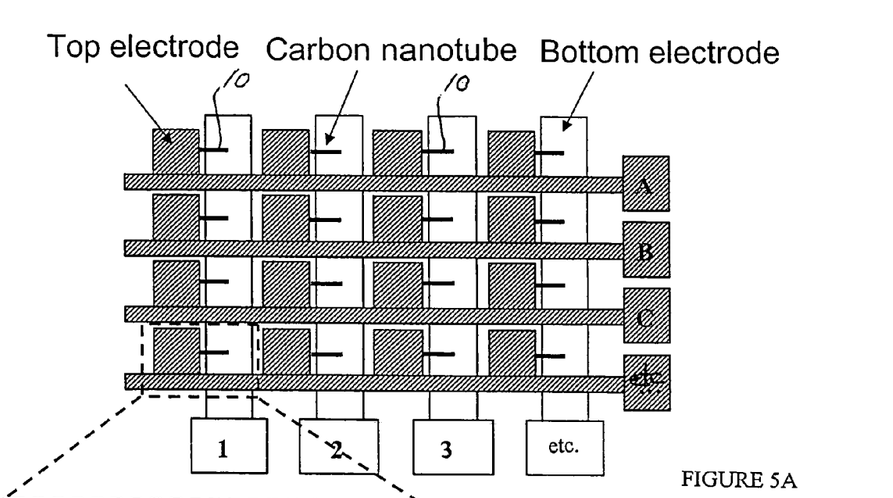
FIG. 5A is a schematic view, with a portion enlarged as shown in FIG. 5B, of a two dimensional (2D) row and column array of NEMS device for multiplexing.
Figure 5B:
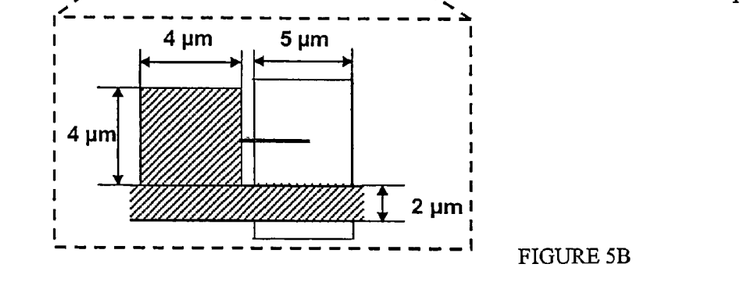

The final product comprises a high density 2D array of a plurality of the NEMS devices shown in FIGS. 5A, 5B and provides multiplexing capabilities. The nano-cantilevers of the NEMS devices in each row of the array are connected to a respective common top electrode which is interconnected to respective electrical contact pads A, B, C, etc., while a respective common bottom electrode is disposed beneath a plurality of the nano-cantilevers of each column of the array. The bottom electrodes are interconnected to respective electrical contact pads 1, 2, 3, etc. By applying voltage between the corresponding pads, the individual NEMS devices can be independently actuated.

The FPN patterning of functional molecules can be scaled up to large scale areas by using parallel FPN techniques as described, for example, by K.-H. Kim N. Moldovan, and H. D. Espinosa, "*A Nanofountain Probe with Sub-100 nm Molecular Writing Resolution,*" Small, Vol. 1, No. 6, pp. 632-635, 2005, the teachings of which are incorporated herein by reference. Alternatively, one can consider functionalization in the nanometer regime by nanoimprint technology. In this approach, the functionalization of the substrate surface is achieved selectively by using a PDMS (PDMS is polydimethylsiloxane) stamp fabricated by molding on a pattern previously generated by e-beam lithography. The application of functional groups on the sample surface can be achieved by pressing the PDMS mold against a flat surface coated with the molecules, followed by alignment and pressing it against the sample surface using a Karl Suss MA6 mask aligner.

The nanoelectromechanical device pursuant to the invention presents a number of very exciting and useful applications. They include ultrasonic wave detection for health monitoring of structures. Based on the highly nonlinear (exponential) dependence of the tunneling current on the gap size at the "lower" stable equilibrium position, Rayleigh waves associated to waves emanating from crack tips or other defects is envisioned. NEMS switches, random-access memory elements, and logic devices can also be built based on the two well-defined stable equilibrium positions, corresponding to "ON" and "OFF" or "0" and "1" logic states, such as for digital electronics. As an example, the functioning of a combination of the nanoelectromechanical device and a solid switch as a memory element is detailed below (see FIG. 6).

Figure 6:
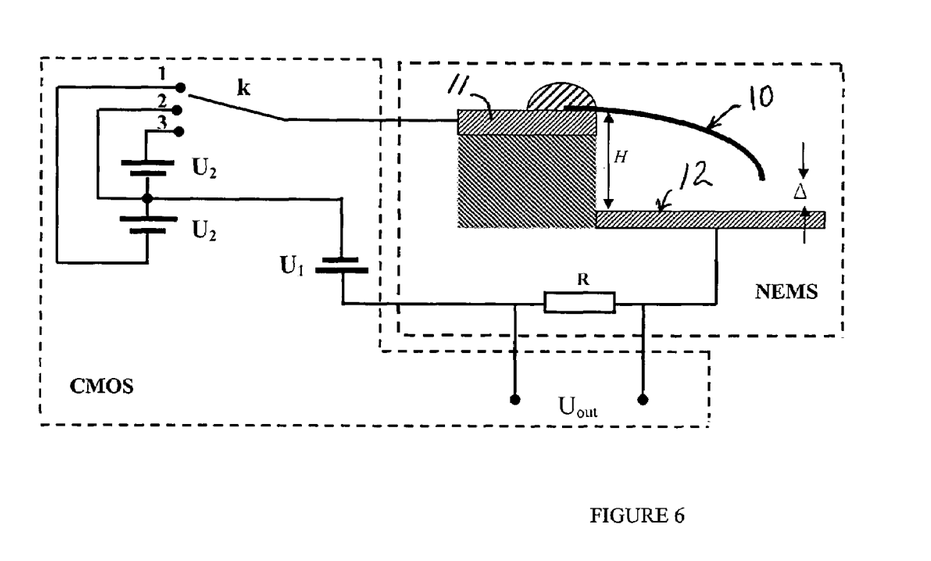
FIG. 6 is a schematic view of the combination of the nano-electromechanical device and a solid state switch of a CMOS circuit to provide a memory element.

The NEMS device is integrated with solid state switching and readout circuitry, which, excluding power supplies voltages U1 and U2, can be implemented by CMOS transistors and decoding logic, FIG. 6. The switch k has three positions, corresponding to the application of three different voltage values to the NEMS device: (1) $U_1-U_2$, (2) $U_1$, (3) $U_1+U_2$. The selection of the voltages $U_1$ and $U_2$ should satisfy the following conditions in order to have the combination of the NEMS device and the solid state switch function as a memory element:

$$V_{PI} > U_1 > V_{PO}$$

$$U_1 + U_2 > V_{PI}$$

$$0 < U_1 - U_2 > V_{PO}$$

where $V_{PI}$, $V_{PO}$ are the pull-in and pull-out voltages, respectively.

When the switch k is in position "1", the total applied voltage is $U_1-U_2$, the nanocantilever goes to its "upper" equilibrium position, if it was in the "lower" equilibrium position, or remains in the "upper" position provided it was there. There is no voltage drop on the feedback resistor R, i.e., $U_{out}=0$. When the switch is in position (2), the total applied voltage is $U_1$, the nanocantilever keeps its original position. There is no voltage drop on the feedback resistor R if the nanocantilever is in its "upper" equilibrium position, i.e., $U_{out}=0$, or there is a voltage drop on the feedback resistor R if the nanocanitlever is in its "lower" equilibrium position, i.e., $U_{out}>0$. Thus, the output voltage provides the necessary information for reading the bit state, without perturbing it. For the correct functioning, the internal impedance of the readout system has to be significantly higher than the value of R. When the switch k is in position (3), the total applied voltage is $U_1+U_2$, the nanocantilever goes to its "lower" equilibrium position, if it was in the "upper" equilibrium position, or remains in the "lower" position provided it was there. There is a voltage drop on the feedback resistor R, i.e., $U_{out}>0$.

In summary, by keeping the device powered at a voltage $U_1$, we have a one bit volatile storage device (it loses its state to "up" when the power is interrupted). From the voltage reading $U_{out}$, we can obtain the bit state ($U_{out}=0$ for "up" and $U_1>U_{out}>0$ for "down"). Setting the state to "up" or "down" can be achieved by applying the writing voltages "$U_1+U_2$" or "$U_1-U_2$", respectively.

The combination pursuant to the invention shown in FIG. 6 employs an electrical circuit incorporated with a resistor to adjust the electrostatic field to achieve the second stable equilibrium position. This feature reduces the constraints in fabricating devices with nanometer gap control between the free standing CNTs or NWs and the substrate. The device is robust and tolerant to the variability in fabrication parameters.

Although the invention has been described in connection with certain embodiments thereof, those skilled in the art will appreciate that the modifications and changes can be made thereto without departing form the spirit and scope of the invention as set forth in the appended claims.

We claim:

1. Electromechanical device having an electrically conductive or semiconducting nano-cantilever wherein the nano-cantilever has a free end that is movable relative to an electrically conductive substrate of a circuit, a power source connected in the circuit for providing a voltage between the substrate and the nano-cantilever to effect bending movement of the nano-cantilever relative to the substrate, and a feedback control for varying the voltage between the substrate and the nano-cantilever in response to the position of the nano-cantilever relative to the substrate wherein two stable positions of the nano-cantilever and a hystersis loop in the current voltage space between a pull-in voltage and a pull-out voltage are provided.

2. The device of claim 1 having a first stable position of the nano-cantilever at a sub-nanometer gap between the free end of the nano-cantilever and the substrate with a pull-in voltage applied and with a stable tunneling electrical current present in the circuit.

3. The device of claim 2 wherein at the first stable position, the elastic force generated in the nano-cantilever from bending movement is equal to the electrostatic force at a stable tunneling current and the inter-atomic van der Waals force.

4. The device of claim 2 wherein the carbon nanotube has an exterior diameter in the range of about 1 nm to about 100 nm.

5. The device of claim 2 wherein the metallic nanowire has a diameter of about 3 nm to about 100 nm.

6. The device of claim 1 having a second stable position of the nano-cantilever with a pull-out voltage between the cantilever and the substrate with little or no tunneling electrical current present in the circuit.

7. The device of claim 6 wherein at the second stable position, the elastic force generated in the nano-cantilever from bending movement is equal to the electrostatic force with little or no tunneling current in the circuit and mostly negligible inter-atomic van der Waals force.

8. The device of claim 1 wherein the nano-cantilever comprises a carbon nanotube or a metallic nanowire.

9. The device of claim 1 wherein the feedback control comprises a resistor connected in the circuit between the power source and the substrate or the nano-cantilever wherein the resistor has a resistance value greater than that of the nano-cantilever and wherein the resistor functions to reduce the voltage in response to the free end of the cantilever moving toward the substrate and to increase the voltage in response to the free end of the cantilever moving away from the substrate.

10. A two dimensional array of devices of claim 1 for multiplexing wherein the nano-cantilevers of a plurality of the devices are connected to a common electrode.

11. The array of claim 10 wherein a common electrically conductive substrate is spaced beneath a plurality of the nano-cantilevers of the devices.

12. The array of claim 10 wherein the devices are arranged in a column and row configuration.

13. Combination of the electromechanical device of claim 1 and a solid state switch in the circuit connected to one or more power sources in a manner that different voltage values can be applied between the nano-cantilever and the electrically conductive substrate to provide first and second stable positions of the nano-cantilever relative to the electrically conductive substrate.

14. The combination of claim 13 wherein at the first stable position, the elastic force generated in the nano-cantilever from bending movement is equal to the electrostatic force at a stable tunneling current and the inter-atomic van der Waals force.

15. The combination of claim 13 wherein the nano-cantilever has a first stable position at the sub-nanometer gap between the end of the nano-cantilever and the substrate with a pull-in voltage applied and with a stable tunneling electrical current present in the circuit.

16. The combination of claim 13 wherein the nano-cantilever has a second stable position with a pull-out voltage applied between the nano-cantilever and the substrate with little or no tunneling electrical current present in the circuit.

17. The combination of claim 16 wherein at the second stable position, the elastic force generated in the nano-cantilever from bending movement is equal to the electrostatic force with little or no tunneling current in the circuit and mostly negligible inter-atomic van der Waals force.

18. The combination of claim 13 wherein the feedback control comprises a resistor connected in the circuit wherein the resistor has a resistance value greater than that of the nano-cantilever, wherein the resistor functions to reduce the voltage in response to the free end of the nano-cantilever moving toward the substrate and to increase the voltage in response to the free end of the nano-cantilever moving away from the substrate, and wherein an output voltage is read from the resistor.

19. Electromechanical device, comprising an electrically conductive or semiconducting nano-cantilever comprising a carbon nanotube or metallic nanowire having a free end movable relative to an electrically conductive electrode, a power source connected to the electrode and the nano-cantilever for applying a pull-in voltage between the electrode and the nano-cantilever to effect relative bending movement of the nano-cantilever toward the electrode, and feedback control resistor between the power source and the electrode for reducing the pull-in voltage between the electrode and the nano-cantilever in response to the free end of the nano-cantilever moving closer to the electrode and for increasing the pull-in voltage between the electrode and the nano-cantilever in response to the free end of the nano-cantilever moving away from the electrode wherein two stable positions of the nano-cantilever and a hystersis loop in the current voltage space between the pull-in voltage and the pull-out voltage are provided.

20. The device of claim 19 having a first stable position of the nano-cantilever occurring at a sub-nanometer gap between the free end of the nano-cantilever and the electrode with a pull-in voltage applied and with a stable tunneling electrical current present in the circuit.

21. The device of claim 19 wherein a second stable position of the nano-cantilever is established when the voltage is less than the pull-in voltage.

22. The device of claim 19 wherein the nano-cantilever is functionalized with biomolecules.

23. A scanning probe microscope, ultrasonic wave detection sensor, NEMS switch, random access memory element, gap sensor, logic device or bio-sensor includes the device of any one of claims 1-22.

24. In a method of moving a free end of an electrically conductive or semiconducting nano-cantilever relative to a conductive substrate of a circuit, the steps of providing a voltage between the substrate and the nano-cantilever to effect bending movement of the nano-cantilever relative to the substrate and varying the voltage between the substrate and the nano-cantilever by feedback control in response to the position of the nano-cantilever relative to the substrate wherein two stable positions of the nano-cantilever and a hystersis loop in the current voltage space between a pull-in voltage and a pull-out voltage are provided.

25. The method of claim 24 having a first stable position of the nano-cantilever at a sub-nanometer gap between the free end of the nano-cantilever and the substrate with a pull-in voltage applied and with a stable tunneling electrical current present in the circuit where, at the first stable position, the elastic force generated in the nano-cantilever from bending movement is equal to the electrostatic force at a stable tunneling current and the inter-atomic van der Waals force.

26. The method of claim 24 having a second stable position of the nano-cantilever with a pull-out voltage between the cantilever and the substrate where, at the second stable position, the elastic force generated in the nano-cantilever from bending movement is equal to the electrostatic force with little or no tunneling current in the circuit and mostly negligible inter-atomic van der Waals force.

27. The method of claim 24 including moving the nano-cantilever that comprises a carbon nanotube or a metallic nanowire.

28. The method of claim 24 wherein the feedback control is provided by connecting a resistor in the circuit, said resistor functioning to reduce the voltage in response to the free end of the nano-cantilever moving toward the substrate and to increase the voltage in response to the free end of the nano-cantilever moving away from the substrate.

* * * * *

UNITED STATES PATENT AND TRADEMARK OFFICE
CERTIFICATE OF CORRECTION

| | |
|---|---|
| PATENT NO. | : 7,612,424 B1 |
| APPLICATION NO. | : 11/385970 |
| DATED | : November 3, 2009 |
| INVENTOR(S) | : Horacio D. Espinosa et al. |

Page 1 of 1

It is certified that error appears in the above-identified patent and that said Letters Patent is hereby corrected as shown below:

Column 1, line 13; replace "may have certain rights" with --- "has certain rights".

Signed and Sealed this

Ninth Day of February, 2010

David J. Kappos
*Director of the United States Patent and Trademark Office*